United States Patent
Xiong et al.

(10) Patent No.: US 10,629,659 B2
(45) Date of Patent: Apr. 21, 2020

(54) DISPLAY DEVICE, MANUFACTURING METHOD AND DISPLAY APPARATUS

(71) Applicants: SHANGHAI TIANMA AM-OLED CO., LTD., Shanghai (CN); TIANMA MICRO-ELECTRONICS CO., LTD., Shenzhen (CN)

(72) Inventors: Zhiyong Xiong, Shanghai (CN); Haigang Chu, Shanghai (CN)

( * ) Notice: Subject to any disclaimer, the term of this patent is extended or adjusted under 35 U.S.C. 154(b) by 395 days.

(21) Appl. No.: 15/171,090

(22) Filed: Jun. 2, 2016

(65) Prior Publication Data
US 2017/0141164 A1 May 18, 2017

(30) Foreign Application Priority Data
Nov. 18, 2015 (CN) .......................... 2015 1 0794015

(51) Int. Cl.
*H01L 27/32* (2006.01)
*G09G 3/3208* (2016.01)
(Continued)

(52) U.S. Cl.
CPC ....... *H01L 27/3244* (2013.01); *G09G 3/3208* (2013.01); *H01L 27/3276* (2013.01);
(Continued)

(58) Field of Classification Search
CPC . H01L 27/3244; H01L 51/5237; H01L 51/56; H01L 27/3248; H01L 51/5228;
(Continued)

(56) References Cited

U.S. PATENT DOCUMENTS

| 2008/0012481 A1* | 1/2008 | Park ................... H01L 27/3244 313/506 |
| 2010/0072482 A1* | 3/2010 | Eom ................... H01L 27/3276 257/72 |

(Continued)

FOREIGN PATENT DOCUMENTS

| CN | 1454035 A | 11/2003 |
| CN | 104425764 A | 3/2015 |

(Continued)

*Primary Examiner* — Jarrett J Stark
(74) *Attorney, Agent, or Firm* — Kilpatrick Townsend & Stockton, LLP

(57) ABSTRACT

The present disclosure provides a method for manufacturing a display device and a display apparatus. The display device includes a substrate including a display region, a driving circuit formed at a vicinity of the display region, a passivation layer covering the driving circuit and including a contact hole exposing the driving circuit, a first conductive layer covering the passivation layer and contacting the driving circuit through the contact hole, and a display element formed in the display region and including a first electrode layer extending from the display region to the driving circuit. The first electrode layer is electrically connected to the driving circuit through the first conductive layer. According to the display device and the manufacturing method thereof, a distance between the packaging region and the display region is shortened, so as to narrow the width of the bezel and realize a narrow bezel structure.

15 Claims, 11 Drawing Sheets

(51) Int. Cl.
 *H01L 51/52* (2006.01)
 *H01L 51/56* (2006.01)

(52) U.S. Cl.
 CPC ...... *H01L 51/5203* (2013.01); *H01L 51/5237* (2013.01); *H01L 51/56* (2013.01); *G09G 2310/0264* (2013.01); *H01L 51/5221* (2013.01)

(58) Field of Classification Search
 CPC ....... H01L 51/5253; H01L 51/524–525; H01L 51/5203–5234; G09G 3/3208; G09G 2310/0264
 See application file for complete search history.

(56) References Cited

U.S. PATENT DOCUMENTS

| | | | | |
|---|---|---|---|---|
| 2015/0008400 A1* | 1/2015 | Kim | .................... | H01L 27/3279 257/40 |
| 2015/0014637 A1* | 1/2015 | Lim | .................... | H01L 27/124 257/40 |
| 2015/0115234 A1* | 4/2015 | Hong | .................... | H01L 51/525 257/40 |
| 2015/0144977 A1* | 5/2015 | Odaka | .................... | H01L 33/44 257/98 |
| 2015/0147831 A1* | 5/2015 | Lee | .................... | H01L 27/3276 438/23 |
| 2016/0172425 A1* | 6/2016 | Lee | .................... | H01L 51/5228 257/40 |
| 2016/0190180 A1* | 6/2016 | Ma | .................... | H01L 27/124 257/40 |
| 2016/0190505 A1* | 6/2016 | Koo | .................... | H01L 51/5228 257/40 |
| 2017/0054102 A1* | 2/2017 | Hong | .................... | H01L 51/529 |
| 2017/0358769 A1* | 12/2017 | Kim | .................... | H01L 51/524 |
| 2018/0018053 A1* | 1/2018 | No | .................... | G06F 3/03545 |

FOREIGN PATENT DOCUMENTS

| | | |
|---|---|---|
| CN | 102347346 B | 6/2015 |
| KR | 10-2014-0014612 A | 2/2014 |

\* cited by examiner

DISPLAY DEVICE, MANUFACTURING METHOD AND DISPLAY APPARATUS

CROSS-REFERENCE TO RELATED APPLICATIONS

This application is based upon and claims priority to Chinese Patent Application 201510794015.4, filed on Nov. 18, 2015, the entire contents of which are incorporated herein by reference.

TECHNICAL FIELD

The present disclosure relates to the field of display technology, and more particularly, to a display device, a manufacturing method of a display device and a display apparatus.

BACKGROUND

As illustrated in FIG. 1, FIG. 1 is a top view of a display device in the prior art. Existing display device 10' mainly includes a display region 2' formed on a substrate 1' and arranged with pixels, a driving circuit 3' and a packaging region 4'. The packaging region 4' surrounds the display region 2', and the driving circuit 3' is disposed between the packaging region 4' and the display region 2'.

As illustrated in FIG. 2, FIG. 2 is a cross sectional view alone line E-E of FIG. 1. A portion A in FIG. 2 represents a schematic cross sectional view among the display region 2', the driving circuit 3' and the packaging region 4', and a portion B represents a schematic cross sectional view of the display region 2'. The substrate 1' includes the display region 2'. The driving circuit 3' is formed at a vicinity of the display region 2'. A passivation layer 5' covers the driving circuit 3' and includes a contact hole exposing the driving circuit 3'. A display element is formed in the display region 2', and the display element includes at least a cathode 6', a driving element layer 7', a pixel defining layer 8' and an organic light emitting layer 9. The cathode 6' extends from the display region 2' to the driving circuit 3', and is electrically connected to the driving circuit 3' through the contact hole. The display device 10 is an active-matrix organic light emitting diode (AMOLED) panel, and the driving element layer 7' further includes elements such as a TFT driving element, an anode, or the like.

In the display device 10', an edge of the cathode 6' extends far beyond the display region 2', and the conduction and connection between the cathode 6' and the lower layer circuit (i.e., the driving circuit 3') are formed at the beyond portion which is positioned over the driving circuit. A distance h by which the cathode 6' extends beyond the display region 2' is greater than 70%, or even 80% of a width H of the driving circuit 3'. Here, a thickness of the cathode 6' may be 150 Å.

Accordingly, film quality in this region has direct influence on the narrow bezel. As illustrated in FIG. 3, FIG. 3 is a schematic diagram of a state of vapor deposition of the display device in the prior art. The display device 10' is disposed on a mask 12' over an evaporation source 13', and the evaporation source 13' forms the cathode (not illustrated in the drawing) by vapor deposition process. Since it is difficult to control a boundary of the vapor deposition process, edges of the formed film may have a relative larger displacement. Accordingly, if the edge is offset to the package region 4', the packaging effect may be influenced, and if the edge is offset to the display region 2', the display device 10' may display abnormally due to bad connection. Thus, the distance between the package region 4' and the display region 2' is generally kept sufficiently large. Particularly, when the driving circuit 3' may be reduced to be very small, such a distance is still required to be kept sufficiently large. This is extremely disadvantageous to the narrow bezel of the display panel.

SUMMARY

According to one aspect of the present disclosure, there is provided a display device. The display device includes a substrate including a display region, a driving circuit formed at a vicinity of the display region, a passivation layer covering the driving circuit and including a contact hole exposing the driving circuit, a first conductive layer covering the passivation layer and contacting the driving circuit through the contact hole, and a display element formed in the display region. The display element has a first electrode layer extending from the display region to the driving circuit. The first electrode layer is electrically connected to the driving circuit through the first conductive layer.

According to another aspect of the present disclosure, there is provided a display apparatus including a display device. The display device includes a substrate having a display region, a driving circuit formed at a vicinity of the display region, a passivation layer covering the driving circuit and including a contact hole exposing the driving circuit, a first conductive layer covering the passivation layer and contacting the driving circuit through the contact hole, a display element formed in the display region. The display element has a first electrode layer extending from the display region to the driving circuit. The first electrode layer is electrically connected to the driving circuit through the first conductive layer.

According to another aspect of the present disclosure, there is further provided a method for manufacturing a display device. The method includes providing a substrate including a display region, forming a driving circuit on the substrate, the driving circuit being disposed at a vicinity of the display region, forming a passivation layer on the driving circuit, forming a first conductive layer on the passivation layer, and forming a display element formed in the display region. The passivation layer covers the driving circuit and comprising a contact hole exposing the driving circuits. The first conductive layer covers the passivation layer and contacts the driving circuit through the contact hole. The display element comprising a first electrode layer extending from the display region to the driving circuit, the first electrode layer being electrically connected to the driving circuit through the first conductive layer.

BRIEF DESCRIPTION OF THE DRAWINGS

Other features, objectives and advantages of the present disclosure will become apparent from the detailed description of non-limiting embodiments with reference to the following accompanying drawings.

DETAILED DESCRIPTION

Figure 1:
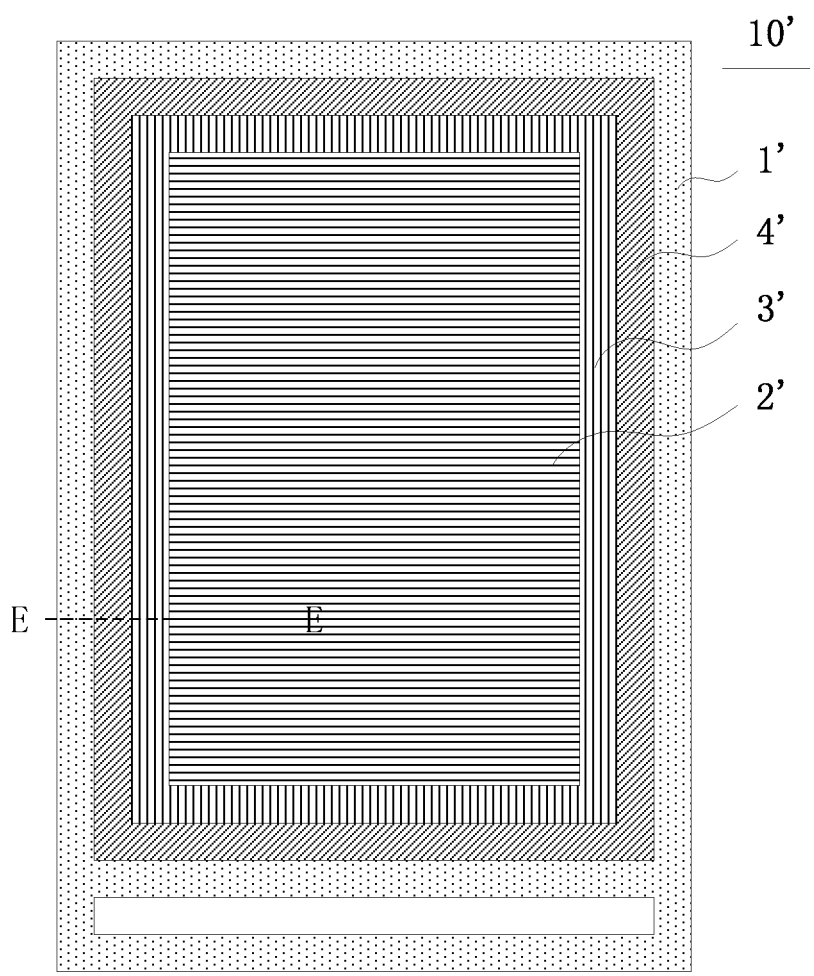
FIG. 1 is a top view of a display device in the prior art.
Figure 2:
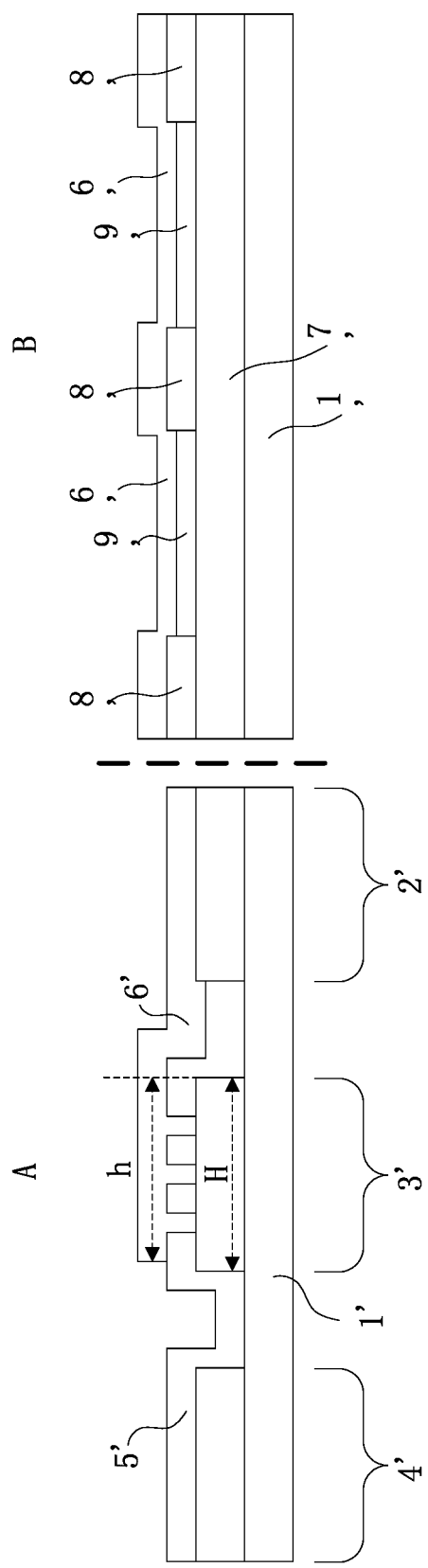
FIG. 2 is a schematic cross sectional view along line E-E of FIG. 1.
Figure 3:
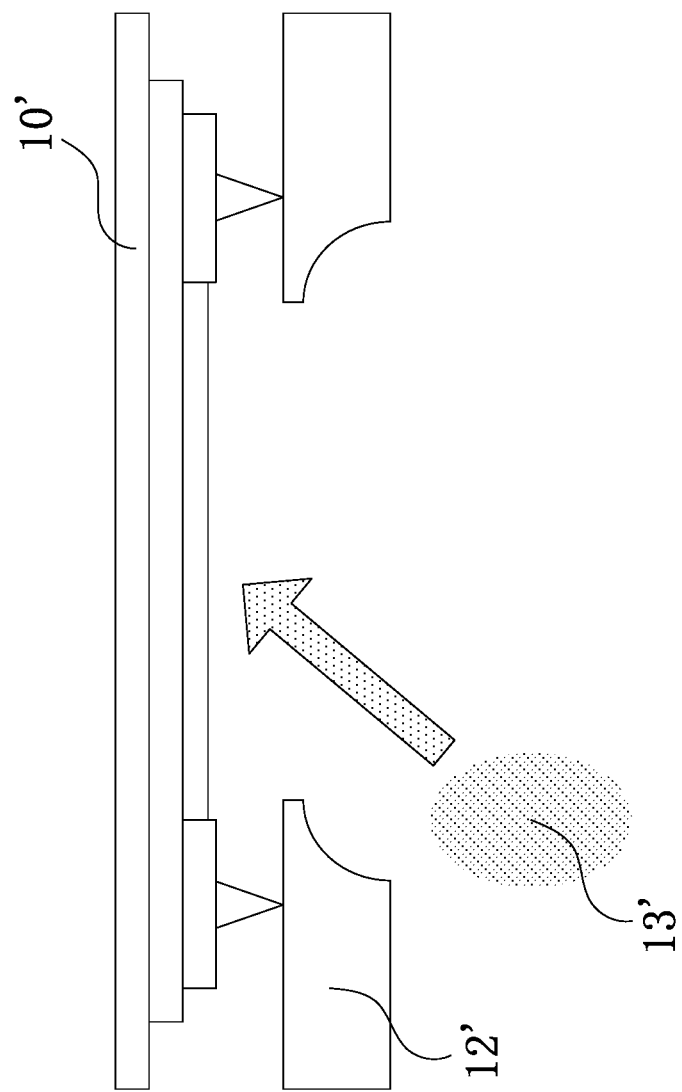
FIG. 3 is a schematic diagram of a state of vapor deposition of the display device in the prior art.

Example implementations will now be described in further detail with reference to the accompanying drawings. The example implementation, however, may be embodied in various forms, and should not be construed as being limited to the implementations set forth herein. Rather, these implementations are provided so that the present invention will become thorough and complete, and will fully convey the concept of the inventive concept to those skilled in the art. Similar reference numerals denote the same or like structures throughout the accompanying drawings, and thus repeat description thereof will be omitted.

The described features, structures or characters may be combined in one or more implementations in any suitable manner. In the following description, numerous specific details are provided so as to allow a full understanding of the embodiments of the present disclosure. However, those skilled in the art will recognize that the technical solutions of the present disclosure may be implemented without one or more of the specific details, or other methods, components, materials and so on may be used. In other cases, the well-known structures, materials or operations are not shown or described in detail to avoid obscuring various aspects of the present disclosure.

Figure 4:
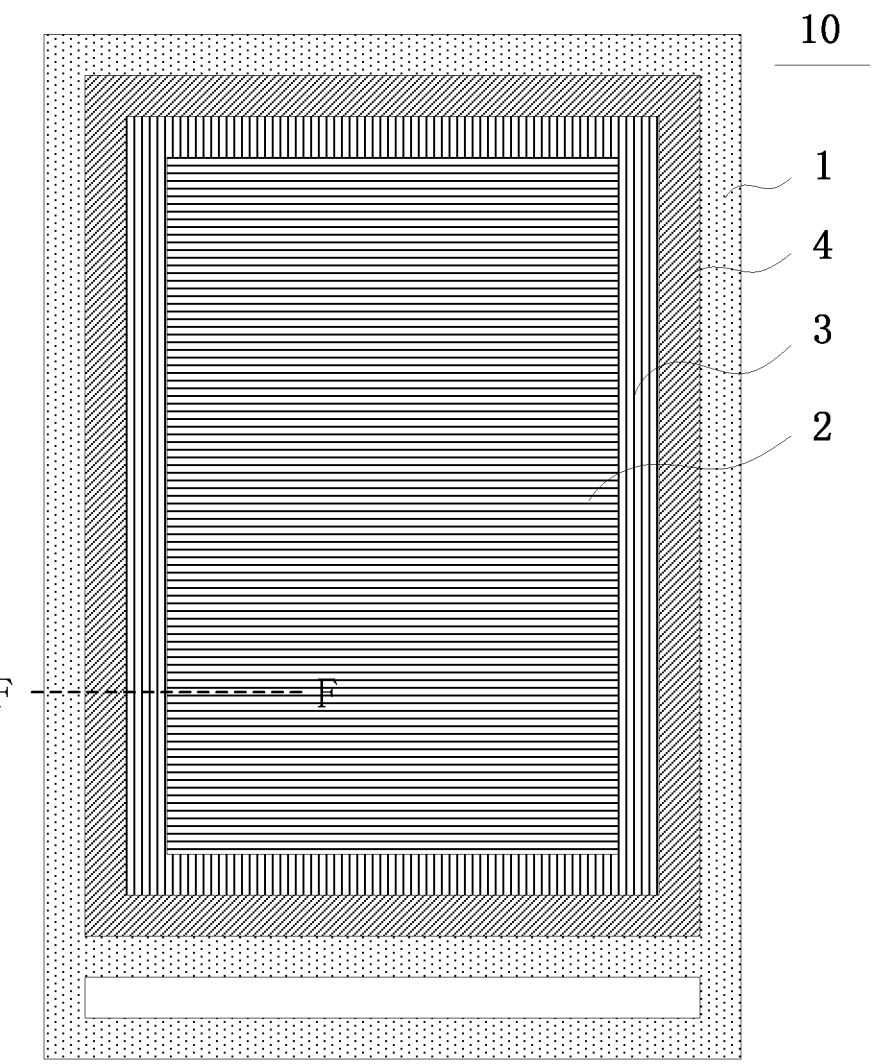
FIG. 4 is a top view of a display device provided in an embodiment of the present disclosure.
Figure 5:
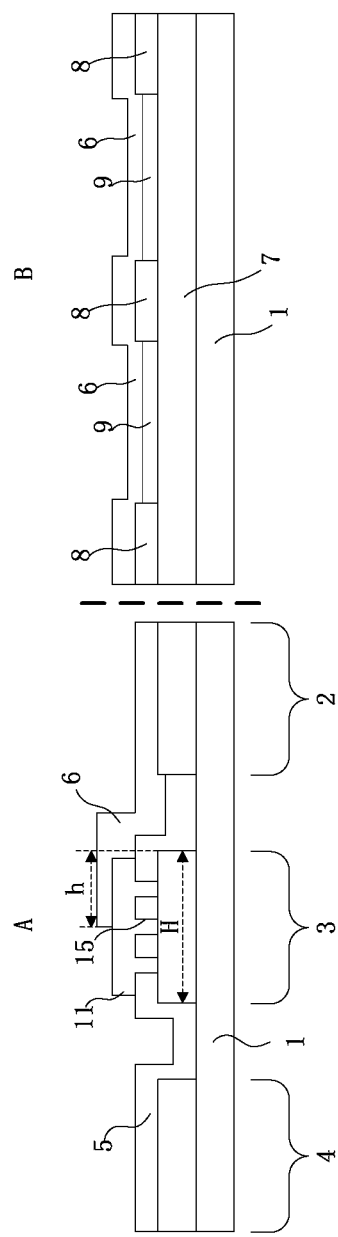
FIG. 5 is a schematic cross sectional view of a display device along line F-F of FIG. 4 according to an embodiment of the present disclosure.

As illustrated in FIGS. 4 and 5, FIG. 4 is a top view of a display device provided by an embodiment of the present disclosure, and FIG. 5 is a schematic cross sectional view along line F-F of FIG. 4. A portion A in FIG. 5 represents a schematic cross sectional view among a display region 2, a driving circuit 3 and a packaging region 4, and a portion B represents a schematic cross sectional view of the display region 2. Referring to FIG. 4 and FIG. 5, a display device 10 provided in the present embodiment of the present disclosure is an AMOLED display device, and in this embodiment, a TFT substrate having a bottom gate structure (i.e., a gate electrode is disposed under a semiconductor layer) is illustrated as an example. The TFT substrate, in this example, includes a substrate 1, and a display region 2, a driving circuit 3, a packaging region 4, a passivation layer 5, a first conductive layer 11 and a display element formed on the substrate 1.

Referring to FIG. 4 and FIG. 5, the driving circuit 3 is formed at a vicinity of the display region 2. The driving circuit 3 may be one of a gate driving circuit, a light emitting control driving circuit and a data driving circuit, but is not limited thereto. The packaging region 4 surrounds the display region 2, and the edges of the first electrode layer 6 are disposed between the display region 2 and the packaging region 4. In the present embodiment, the first electrode layer 6 may be a cathode. However, in this embodiment, only the cathode is illustrated as an example, and a corresponding second electrode layer may be an anode. This is not intended to be limiting. In other embodiments of the present disclosure, the light emitting display device may have a reversed structure, in which the first electrode layer 6 is the anode and the second electrode layer is the cathode. The passivation layer 5 covers the driving circuit 3 and includes at least a contact hole 15 exposing the driving circuit 3. The first conductive layer 11 covers the passivation layer 5, contacts the driving circuit 3 through the contact hole 15, and is electrically connected to the driving circuit 3. The first conductive layer 11 includes an inner edge portion extending towards the display region 2 and an outer edge portion extending away from the display region 2. In the present embodiment, the first conductive layer 11 is formed of indium tin oxide (ITO). However, ITO is only illustrated as an example in the present embodiment. In other embodiments of the present disclosure, other material may be used to form the first conductive layer as long as it is conductive. However it is not limited thereto.

The display element is formed in the display region 2, and includes a first electrode 6 (i.e., a cathode), an organic light emitting layer 9, a pixel defining layer 8 and a driving element layer 7. In the embodiment, the driving element layer 7 includes devices such as a TFT element, a second electrode layer and the like. In addition, the second electrode layer is disposed at a side of the driving element layer 7 closest to the organic light emitting layer 9. The first electrode layer 6, the organic light emitting layer 9 and the second electrode layer constitute the light emitting device. When the first electrode layer 6 and the second electrode are applied with a driving voltage, the organic light emitting layer 9 is driven to emit light. The pixel defining layer 8 includes a plurality of openings, and the organic light emitting layer 9 is disposed in the plurality of openings of the pixel defining layer 8. The pixel defining layer 8 and the passivation layer 5 are in the same layer and are homogeneous, and are formed in the same layer during the manufacturing process without additional processing steps. However, the present disclosure is not limited thereto. The first electrode layer 6 is formed on the organic light emitting layer 9 and the pixel defining layer 8. The first electrode layer 6 extends from the display region 2 to the driving circuit 3. The first electrode 6 is only required to be connected to the first conductive layer 11, and the first conductive layer 11, as a medium, serves similarly as a bridge and changes a connection distance of the first electrode layer 6, thereby significantly reducing a connection position of the outmost contact hole of the passivation layer 5.

During the manufacturing process of the OLED device, since the first electrode layer and the organic light emitting layer are required to be formed by vapor deposition, and other device layers may be formed by etching metal layers or nonmetal layers. The vapor deposition process generally has a large processing deviation, and the etching process is relatively fine and has a deviation less than 2 μm. The first conductive layer 11 is formed on the passivation layer 5 by etching process with a relatively smaller deviation, thereby solving the limitation that a relatively wider contact region for the first electrode is required in the prior art. Accordingly, the first electrode 6 not required to be directly connected to the outmost contact hole of the passivation layer 5, thereby reducing the width of the region of the diving circuit 3 and facilitating the narrowing of the bezel.

In the present embodiment, the inner edge portion and outer edge portion of the first conductive layer 11 and the edge of the first electrode layer 6 are disposed within the region of the driving circuit 3, but it is not limited thereto. A distance h by which the edge of the first electrode layer 6 extends into the region of the driving circuit 3 is 30% to 40% of a width H of the driving circuit 3, which is far smaller than that in the prior art. In addition the inner edge portion of the first conductive layer 11 may be disposed between the driving circuit 3 and the display region 2, but it is not limited thereto. The edge of the first electrode 6 may also be disposed between the driving circuit 3 and the display region 2, but it is not limited thereto.

Figure 6:
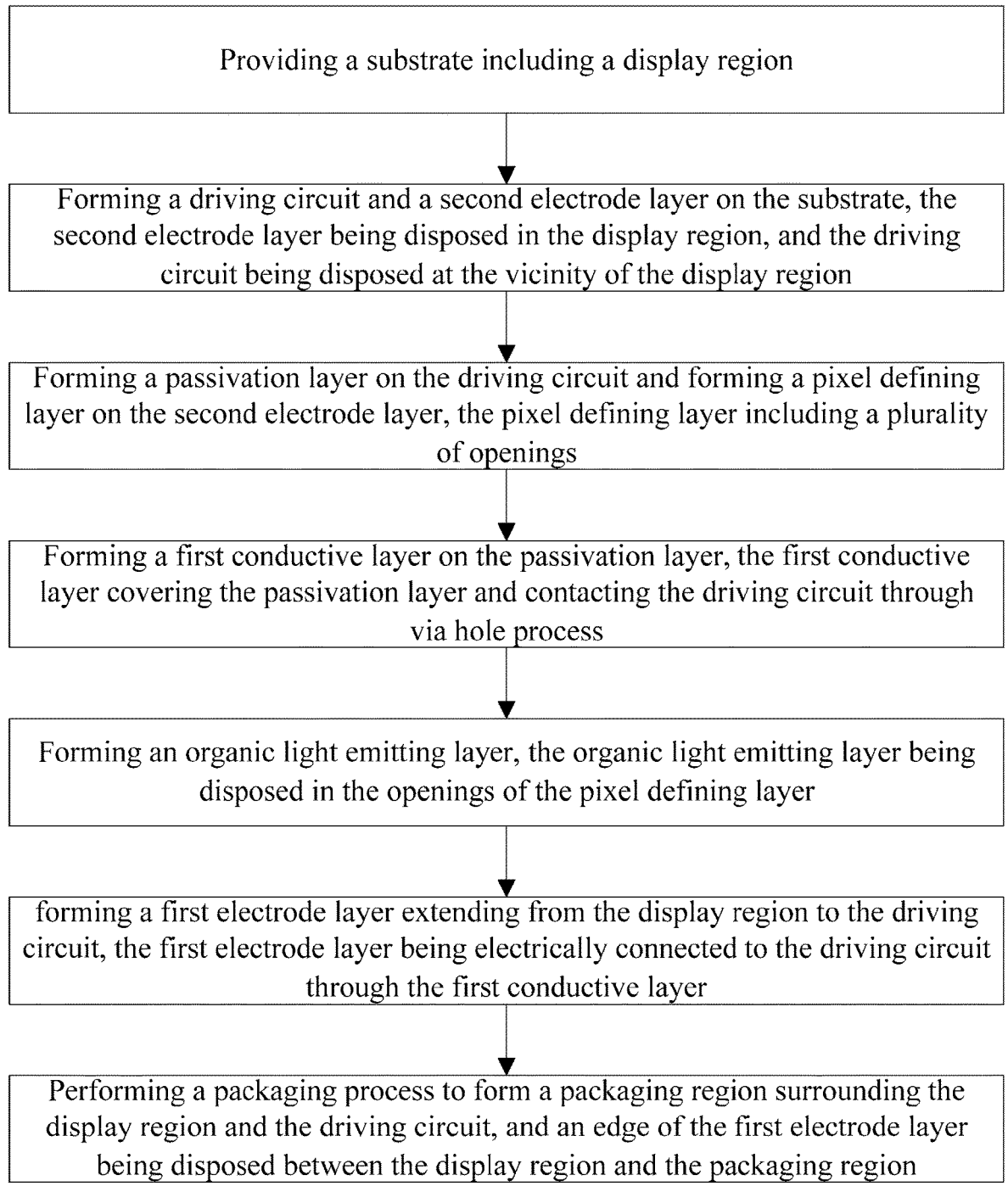
FIG. 6 is a flow chart illustrating a method for manufacturing the display device according to an embodiment of the present disclosure.

As illustrated in FIG. 6, FIG. 6 is a flow chart of a method for manufacturing the display device illustrated in FIG. 5. Referring to FIG. 5 and FIG. 6, the method for manufacturing the display device provided in the present embodiment includes the steps as follows.

First, a substrate 1 including a display region 2 is provided.

Next, a driving circuit 3 and a driving element layer 7 are formed on the substrate 1. The driving element layer includes a TFT device and a second electrode layer. The second electrode layer is disposed in the display region 2. The driving circuit 3 is disposed at a vicinity of the display region 2. The driving circuit 3 and the driving element layer 7 are formed by filming and etching processes, and the detailed processes are similar to those in the prior art, which will not be repeated herein. In the embodiment, the driving element layer 7 includes the TFT device and the second electrode layer, wherein the second electrode layer is disposed at the uppermost layer of the driving element layer 7. That is, the second electrode layer is a layer that is farthest away from the substrate 1 in the driving element layer 7. In addition, in the present embodiment, the second electrode layer is formed of ITO.

Next, a passivation layer 5 is formed on the driving circuit 3, and a pixel defining layer 8 including a plurality of openings is formed on the second electrode layer. The passivation layer 5 and the pixel defining layer 8 are formed in the same layer and are homogeneous. In the present embodiment, the passivation layer 5 and the pixel defining layer 8 are formed of organic material and may be formed directly by exposing and developing processes, thereby may be controlled more precisely.

Next, a first conductive layer 11 is formed on the passivation layer 5 and covers the passivation layer 5, and the first conductive layer 11 contacts the driving circuit 3 by a via hole process. The first conductive layer 11 is formed by the processes of conductive layer filming, photoresist coating, exposing, developing, etching and photoresist stripping. The manufacturing of the first conductive layer 11 is similar to the etching process for conductive layers in the array process in the prior art, which will not be repeated herein. Since the first conductive layer is formed by etching process, it may be controlled more precisely, generally having a deviation less than 2 μm. In the present embodiment, the first conductive layer 11 is formed of ITO.

Next, an organic light emitting layer 9 is formed. The organic light emitting layer is disposed in the plurality of openings in the pixel defining layer 8. The organic light emitting layer 9 is formed by vapor deposition. Generally, an OLED display device includes a plurality of colors such as red, green and blue. When the display device includes different colors, a plurality of vapor deposition processes are required to form the organic light emitting layers 9 of different color into corresponding openings of the pixel defining layer 9.

Next, a first electrode layer 6 (i.e., a cathode) extending from the display region 2 to the driving circuit 3 is formed. The first electrode layer 6 is electrically connected to the driving circuit 3 through the first conductive layer 11. The first electrode layer 6 is formed by vapor deposition. In the display region, the first electrode layer 6 has a planer structure covering the entire display region and extends to the region of the driving circuit 3 from the display region 2.

At last, a packaging process is performed. The packaging region 4 surrounds the display region 2 and the driving circuit 3, and the edge of the first electrode layer 6 is disposed between the display region 2 and the packaging region 4.

In the embodiment, the distance h by which the edge of the first electrode layer 6 extends into the region of the driving circuit 3 is 30% to 40% of the width H of the driving circuit 3, which is far smaller than that in the prior art.

In the present embodiment, the OLED display device has a top emission structure, but it is not limited thereto. In other embodiments, the OLED display device may have a flipped structure. That is, the positions of the cathode and the anode may be interchanged, and the positions of the first electrode and the second electrode may also be interchanged, which will not be repeated herein.

In the present disclosure, using an array process (including steps such as filming, exposing, etching, striping and the like), a transparent ITO is formed on the contact hole of the passivation layer 5, and the width of the ITO may be just enough to cover the contact hole. The ITO improves the contact region and contact effect of the driving circuit of the first electrode layer, and overcome the problem of poor processing accuracy. The boundary control of the array process is far better than the vapor deposition process, and thus the displacement of the boundary in the array process is very small. Other portions are etched away in the array process. Since the array process has a very high accuracy, it is unnecessary to leave a very wide distance for the covering of the first electrode layer 6, and is unnecessary to leave a very larger distance between the packaging region 4 and the display region 2, and meanwhile the edge of the first electrode layer 6 may be appropriately reduced.

Figure 7:
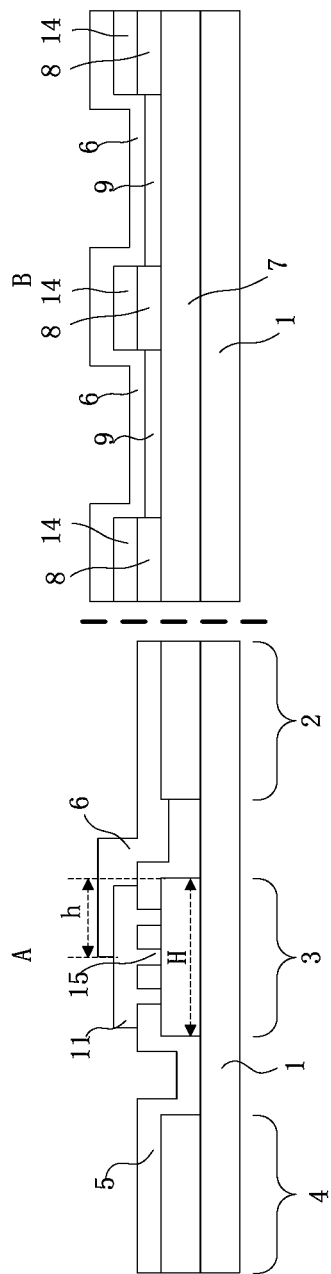
FIG. 7 is another schematic cross sectional view of a display device along line F-F of FIG. 4 according to an embodiment of the present disclosure.

Referring to FIG. 4 and FIG. 7, FIG. 4 is a top view of a display device provided by an embodiment of the present disclosure, and FIG. 7 is another schematic cross sectional view along line F-F of FIG. 4. A portion A in FIG. 7 represents a schematic cross sectional view among the display region 2, the driving circuit 3 and the packaging region 4, and a portion B represents a schematic cross sectional view of the display region 2.

Compared with FIG. 5, the embodiment showed in FIG. 7 differs in that while forming the first conductive layer, a second conductive layer (i.e., an ITO layer) is formed on the pixel defining layer of the display region. After the forming of the organic light emitting layer, the first electrode layer is overlapped on the second conductive layer (i.e., the ITO layer), which is advantageous to reducing the resistance of the first electrode layer, thereby further reducing power consumption.

The display device 10 according to the present embodiment is an AMOLED display device, a TFT substrate having a bottom gate structure (i.e., a gate electrode is disposed under a semiconductor layer) is illustrated as an example. The TFT substrate includes: a substrate 1, and a display region 2, a driving circuit 3, a packaging region 4, a passivation layer 5, a first conductive layer 11 and a display element formed on the substrate 1.

The driving circuit 3 is formed at a vicinity of the display region. The driving circuit 3 may be one of a gate driving circuit 3, a light emitting control driving circuit 3 and a data driving circuit 3, but is not limited thereto. The packaging region 4 surrounds the display region 2, and in the present embodiment, the edges of the first electrode layer 6 are disposed between the display region 2 and the packaging region 4. Similar to the prior embodiments, in the present embodiment, the first electrode layer 6 may be a cathode. However, in this embodiment, only the cathode is illustrated as an example, and the corresponding second electrode layer may be an anode, but it is not limited thereto. In other embodiments of the present disclosure, the light emitting display device may have a reversed structure, in which the first electrode layer 6 is the anode and the second electrode layer is the cathode. The passivation layer 5 covers the driving circuit 3 and includes at least a contact hole 15 exposing the driving circuit 3. The first conductive layer 11 covers the passivation layer 5, and contacts the driving circuit 3 through the contact hole 15. The first conductive layer 11 includes an inner edge portion extending towards the display region 2 and an outer edge portion extending away from the display region 2. In the present embodiment, the first conductive layer 11 is formed of ITO, however, ITO is only taken for example in the present embodiment, and in other embodiments of the present disclosure, other material may be used to form the first conductive layer as long as it is conductive. However, the present disclosure is not limited thereto.

The display element is formed in the display region 2, and includes a first electrode 6 (i.e., a cathode), an organic light emitting layer 9, a second conductive layer 14, a pixel defining layer 8 and a driving element layer 7. In the embodiment, the driving element layer 7 includes devices such as a TFT element, a second electrode layer and the like. In addition, the second electrode layer is disposed at a side of the driving element layer 7 closest to the organic light emitting layer 9. The first electrode layer 6, the organic light emitting layer 9 and the second electrode layer constitute the light emitting device. When the first electrode layer 6 and the second electrode are applied with a driving voltage, the organic light emitting layer 9 is driven to emit light. The pixel defining layer 8 includes a plurality of openings, and the organic light emitting layer 9 is disposed in the plurality of openings of the pixel defining layer 8. The pixel defining layer 8 and the passivation layer 5 are in the same layer and are homogeneous, and are formed in the same layer during the manufacturing process without additional processing steps. However, the present disclosure is not limited thereto. The first electrode layer 6 is formed on the organic light emitting layer 9 and the pixel defining layer 8. The first electrode layer 6 extends from the display region 2 to the driving circuit 3. The first electrode layer 6 covers an inner edge portion of the first conductive layer 11. The second conductive layer 14 is formed between the pixel defining layer 8 and the first electrode layer 6. The second conductive layer 14 and the first conductive layer 11 are in the same layer and are homogeneous, which is advantageous to the reduction of processing steps. However, the present disclosure is not limited thereto. With the addition of the second conductive layer 14, a thickness of the first electrode 6 may be regarded as being increased in the display region, such that the thickness of the first electrode 6 is thicker than that in the prior art. For example, the total thickness may be 500 Å, but it is not limited thereto. In comparison to the thickness 150 Å of the cathode 6' in the prior art, power consumption in the case of thicker cathode is reduced by 21% than that in the case of thinner cathode.

Figure 8:
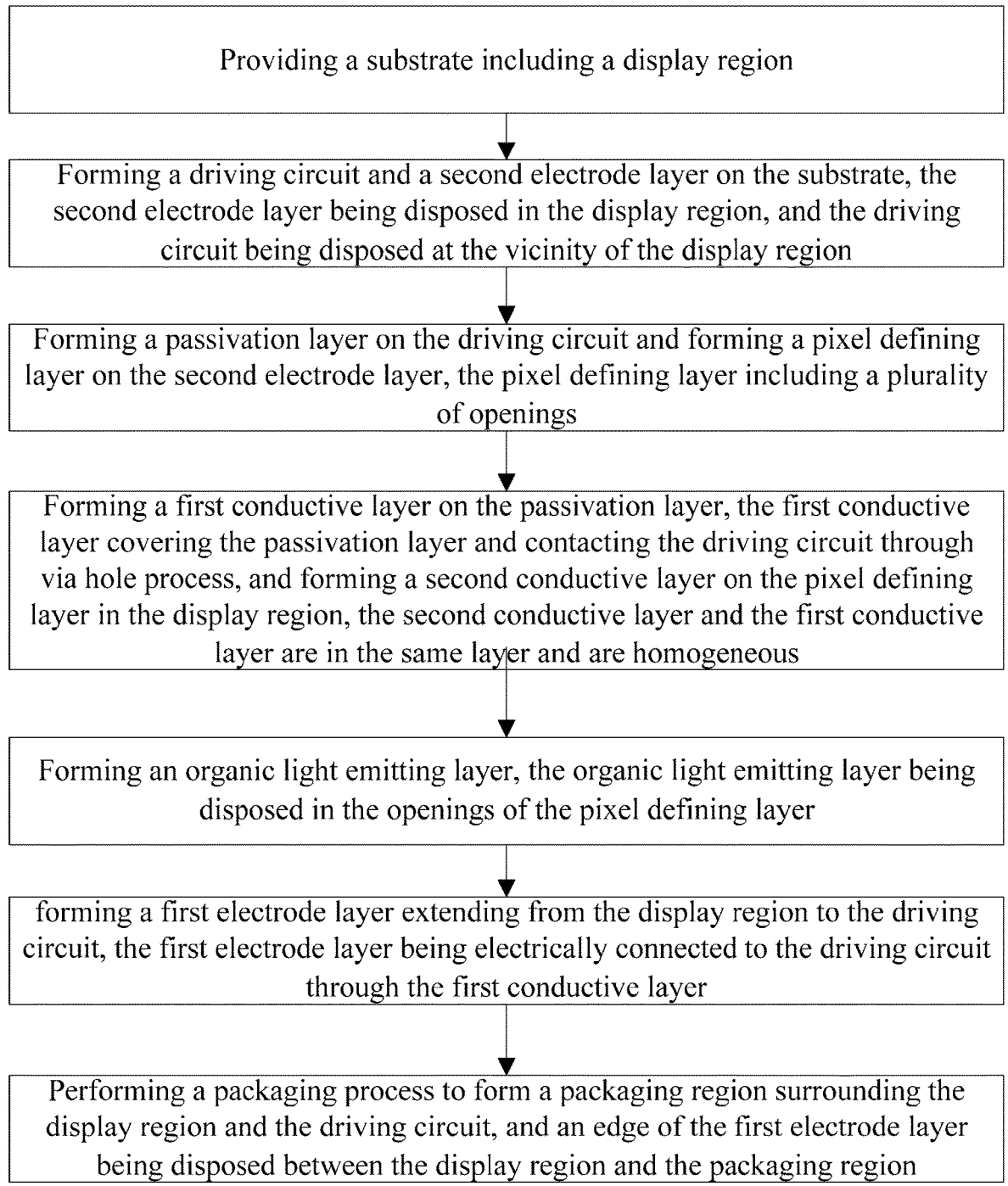
FIG. 8 is a flow chart illustrating a method for manufacturing the display device according to another embodiment of the present disclosure.

As illustrated in FIG. 8, FIG. 8 is a flow chart of a method for manufacturing the display device illustrated in FIG. 7. Steps in the present embodiment that is similar to those in the manufacturing method provided with reference to FIG. 6 will be described in brief, and the detailed description thereof may refer to corresponding description regarding FIG. 6. Accordingly, only the differences therebetween are described in detail. With reference to FIG. 7 and FIG. 8, the method for manufacturing the display device showed in FIG. 7 includes the steps as follows.

First, a substrate 1 including a display region 2 is provided.

Next, a driving circuit 3 and a driving element layer 7 are formed on the substrate 1. The driving element layer includes a TFT device and a second electrode layer. The second electrode layer is disposed in the display region 2. The driving circuit 3 is disposed at a vicinity of the display region 2.

Next, a passivation layer 5 is formed on the driving circuit 3, and a pixel defining layer 8 including a plurality of openings is formed on the second electrode layer.

Next, a first conductive layer 11 is formed on the passivation layer 5 and covers the passivation layer 5, and the first conductive layer 11 contacts the driving circuit 3 by a via hole process. A second conductive layer 14 is formed on the pixel defining layer in the display region. The second conductive layer 14 and the first conductive layer 11 are in the same layer and are homogeneous. The second conductive layer includes a plurality of openings, and an opening of the second conductive layer 14 has a same profile with that of an opening in the pixel defining layer 8. The second conductive layer 14 and the first conductive layer 11 are formed in the same layer, and during the etching process, conductive material on the pixel defining layer 8 in the display region 2 are maintained.

Next, an organic light emitting layer 9 is formed. The organic light emitting layer 9 is formed in the plurality of openings of the pixel defining layer 8, i.e., in the plurality of openings of the second conductive layer 14.

Next, a first electrode layer 6 extending from the display region 2 to the driving circuit 3 is formed. The first electrode layer 6 is electrically connected to the driving circuit 3 through the first conductive layer 11.

At last, a packaging process is performed. The packaging region 4 surrounds the display region 2 and the driving circuit 3, and the edge of the first electrode layer 6 is disposed between the display region 2 and the packaging region 4.

In the embodiment, the distance h by which the edge of the first electrode layer 6 extends into the region of the driving circuit 3 is 30% to 40% of the width H of the driving circuit 3, which is far smaller than that in the prior art.

In the present disclosure, on one hand, using an array process (including steps such as filming, exposing, etching, striping and the like), a transparent ITO is formed on the contact hole of the passivation layer 5, and the width of the ITO may be just enough to cover the contact hole. The ITO improves the contact region and contact effect of the driving circuit of the cathode, and overcome the problem of poor processing accuracy. The boundary control of the array process is far better than the vapor deposition process, and thus the displacement of the boundary in the array process is very small. Other portions are etched away in the array process. Since the array process has a very high accuracy, it is unnecessary to leave a very wide distance for the covering of the first electrode layer 6, and is unnecessary to leave a very larger distance between the packaging region 4 and the display region 2, and meanwhile the edge of the first electrode layer 6 may be appropriately reduced. On the other hand, by forming a second conductive layer that is in the same layer and is homogeneous with the first conductive layer 11 in the display region 2, resistance of the first electrode layer 6 may be further reduced, thereby reducing power consumption of the display device.

Figure 9:
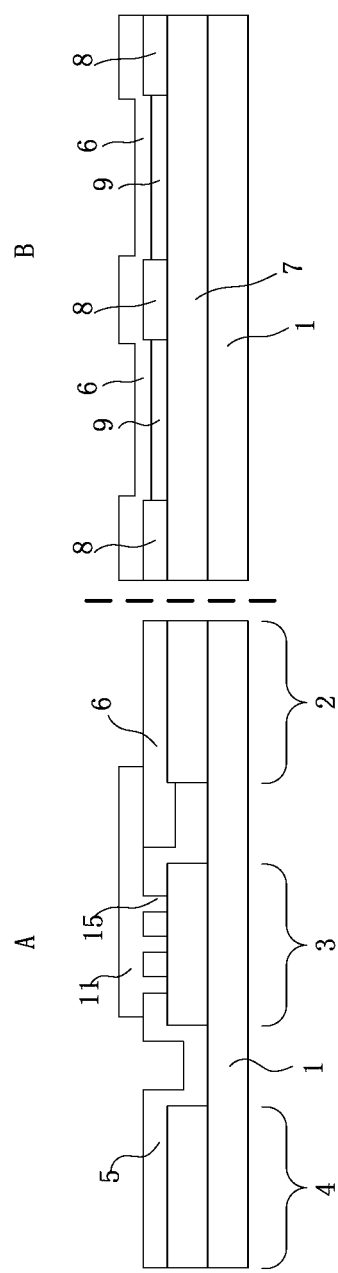
FIG. 9 is another schematic cross sectional view of a display device along line F-F of FIG. 4 according to an embodiment of the present disclosure.

Referring to FIG. 4 and FIG. 9, FIG. 4 is a top view of a display device provided by an embodiment of the present disclosure, and FIG. 9 is another schematic cross sectional view of the display device according an embodiment of the present disclosure along line F-F of FIG. 4. A portion A in FIG. 9 represents a schematic cross sectional view among the display region 2, the driving circuit 3 and the packaging region 4, and a portion B represents a schematic cross sectional view of the display region 2.

Compared with FIG. 5, the embodiment showed in FIG. 9 differs in that the first conductive layer covers over the cathode rather than below the cathode.

The first conductive layer 11 includes an inner edge portion extending towards the display region 2 and an outer edge portion extending away from the display region 2, and the inner edge portion of the first conductive layer 11 covers the edge of the first electrode layer 6. Both the inner edge portion of the first conductive layer 11 and the edge of the first electrode layer 6 are disposed between the driving circuit 3 and the display region 2, but it is not limited thereto. Other technical features are similar to those in FIG. 5, which will not be repeated herein.

In addition, similar to the embodiment provided in FIG. 7 of the present disclosure, the display region of the present embodiment may also include a second conductive layer, and the second conductive layer of the present embodiment may be disposed on the first electrode layer 11. The first electrode layer 11 has a planer structure covering the entire display region, and the second conductive layer provided in the present embodiment may also has a planer structure covering the entire display region on the first electrode layer 11, thereby reducing the resistance of the first electrode layer, and thereby reducing power consumption.

In the present embodiment, the first conductive layer 11 may be formed by etching process. During the manufacturing process of the OLED device, since the first electrode layer 6 and the organic light emitting layer 9 are required to be formed by vapor deposition, and other device layers may be formed by etching metal layers or nonmetal layers. The vapor deposition process generally has a large processing deviation, and the etching process is relatively fine and has a deviation less than 2 μm. The first conductive layer 11 is formed by etching process with a relatively smaller deviation, thereby solving the limitation that a relatively wider contact region for the first electrode is required in the prior art. Accordingly, the first electrode 6 not required to be directly connected to the outmost contact hole of the passivation layer 5, thereby reducing the width of the region of the diving circuit 3 and facilitating the narrowing of the bezel. In addition, in other embodiments of the present disclosure, the display region may further include a second conductive layer covering over the first electrode layer. The second conductive layer and the first conductive layer are in the same layer and are homogeneous, the providing the second conductive layer may correspond to increasing the thickness of the first electrode layer, thereby reducing the resistance of the first electrode layer, and thereby reducing power consumption.

Figure 10:
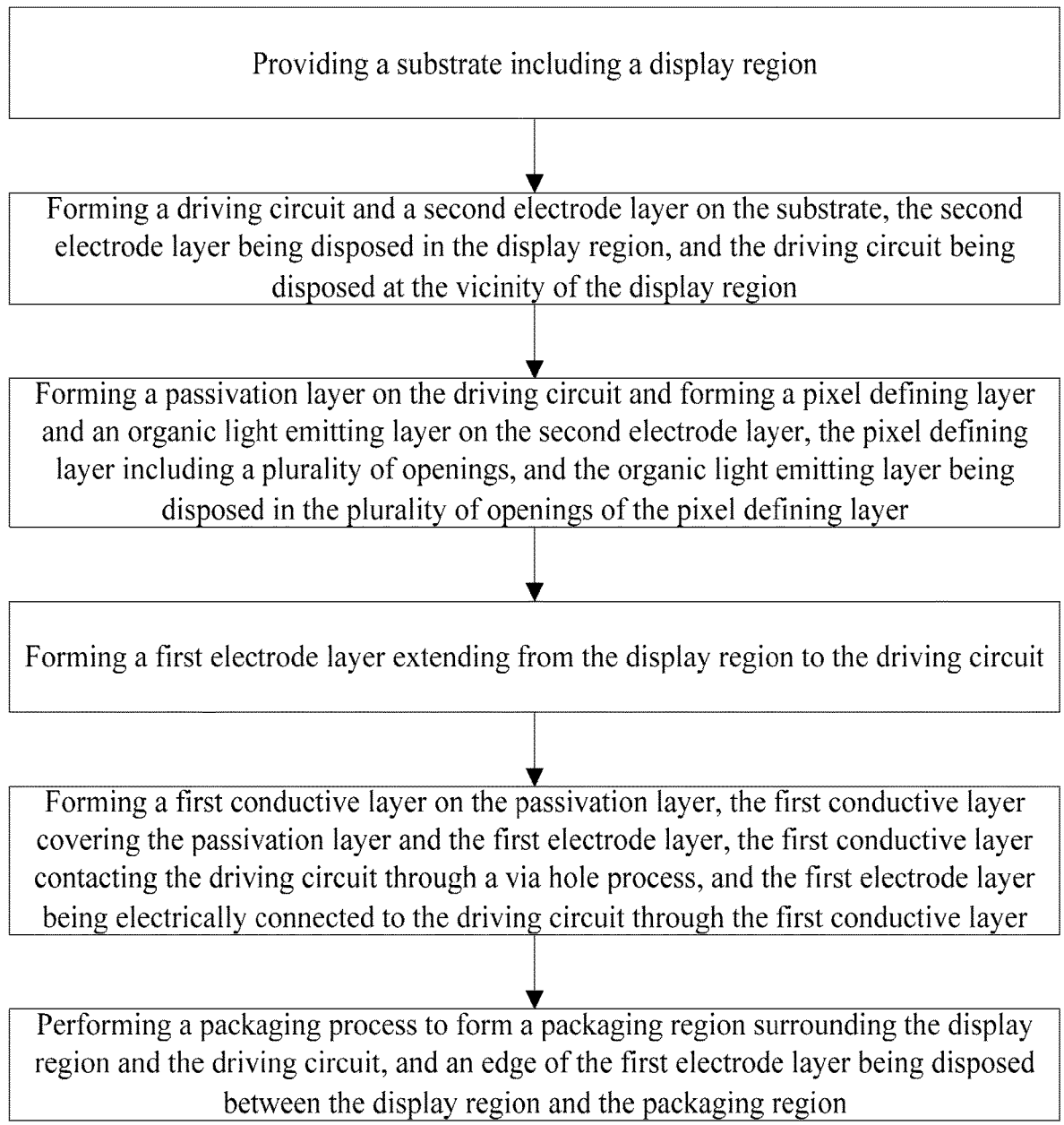
FIG. 10 is a flow chart illustrating a method for manufacturing the display device according to another embodiment of the present disclosure.

As illustrated in FIG. 10, FIG. 10 is a flow chart of a method for manufacturing a display device illustrated in FIG. 9. Steps in the present embodiment that is similar to those in the manufacturing method provided with reference to FIG. 6 will be described in brief, and the detailed description thereof may refer to corresponding description regarding FIG. 6. Accordingly, only the differences therebetween are described in detail.

With reference to FIG. 9 and FIG. 10, the method for manufacturing the display device showed in FIG. 9 includes the steps as follows.

First, a substrate 1 including a display region 2 is provided.

Next, a driving circuit 3 and a driving element layer 7 are formed on the substrate 1. The driving element layer includes a TFT device and a second electrode layer. The second electrode layer is disposed in the display region 2. The driving circuit 3 is disposed at a vicinity of the display region 2.

Next, a passivation layer 5 is formed on the driving circuit 3, and a pixel defining layer 8 and an organic light emitting layer 9 are formed on the second electrode layer. The pixel defining layer 8 includes a plurality of openings. The organic light emitting layer 9 is formed in the plurality of openings of the pixel defining layer 8.

Next, a first electrode layer 6 extending from the display region 2 to the driving circuit 3 is formed.

Next, a first conductive layer 11 is formed on the passivation layer 5 and covers the passivation layer 5 and the first electrode layer 6, the first conductive layer 11 contacts the driving circuit 3 by a via hole process. The first electrode layer 6 is electrically connected to the driving circuit 3 through the first conductive layer 11. In the present embodiment, the first conductive layer 11 is also formed by array process similar to those in other embodiments of the present disclosure. Accordingly, processing accuracy may be improved, thereby ensuring the connection accuracy of the first electrode layer 6 and the driving circuit 3. At last, a packaging process is performed. The packaging region 4 surrounds the display region 2 and the driving circuit 3, and the edge of the first electrode layer 6 is disposed between the display region 2 and the packaging region 4.

In the present embodiment, the order of the steps for forming the first conductive layer and the cathode is interchanged, such that the first conductive layer may be covered over the cathode, and the edge of the first electrode layer 6 is not required to extend into the region of the driving circuit 3, which is further advantageous to reducing the distance between the packaging region 4 and the display region 2.

Figure 11:
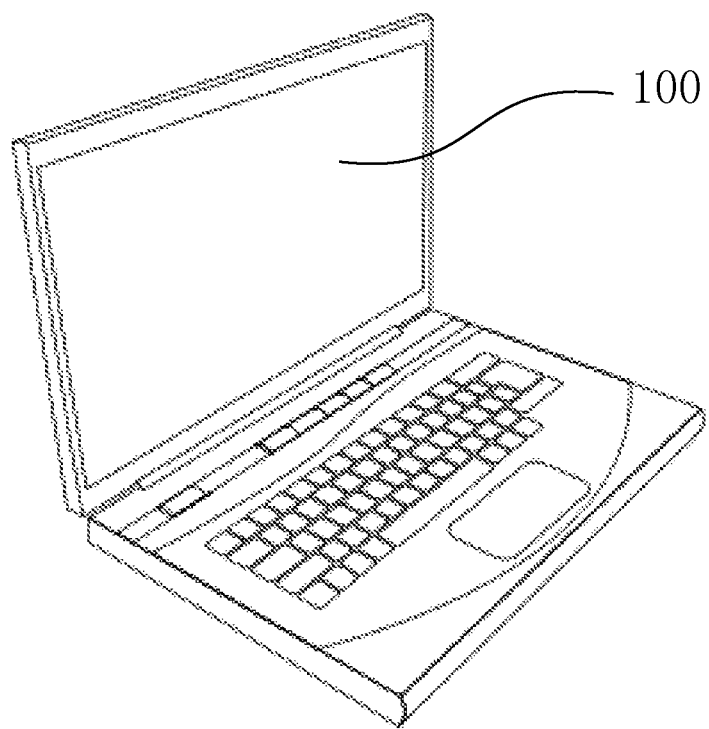
FIG. 11 is a schematic view of an exemplary display apparatus according to the disclosed embodiments.

Referring to FIG. 11, FIG. 11 is a schematic view of an exemplary display apparatus according to the disclosed embodiments. The present embodiment of the present disclosure provides a display apparatus which includes, but not limited to, the display device 100 according to any one of the above embodiments. In particular, the display apparatus includes a display device. The display device includes: a substrate having a display region, a driving circuit formed at a vicinity of the display region, a passivation layer covering the driving circuit and including a contact hole exposing the driving circuit, a first conductive layer covering the passivation layer and contacting the driving circuit through the contact hole; and a display element formed in the display region and including a first electrode layer extending from the display region towards the driving circuit, and the first electrode layer being electrically connected to the driving circuit through the first conductive layer.

Accordingly, according to the display device and the manufacturing method thereof, the distance between the packaging region and the display region is shortened, so as to narrow the width of the bezel and realize a narrow bezel structure.

Detailed embodiments of the present disclosure have been described above. It should be appreciated that, the present disclosure is not limited to the above particular implementations. Various changes or modifications, which do not affect the substantial content of the present disclosure, are available to those skilled in the art within the scope of the claims.

What is claimed is:

1. A display device, comprising:
   a substrate comprising a display region;
   a driving circuit formed at a vicinity of the display region;
   a passivation layer covering the driving circuit and comprising a contact hole exposing the driving circuit;
   a first conductive layer covering the passivation layer and contacting the driving circuit through the contact hole, the first conductive layer being formed by an etching process; and
   a first electrode layer formed by vapor deposition and extending from the display region to the driving circuit, the first electrode layer being electrically connected to the driving circuit through the first conductive layer,
   wherein a first distance by which a first edge of the first electrode layer is extended into the region of the driving circuit is less than a width of the driving circuit, and the first conductive layer is partly overlapped with the first electrode layer, wherein a distal edge of the first conductive layer is extended into the first region of the driving circuit further than the first edge of the first electrode layer.

2. The display device according to claim 1, wherein the substrate further comprises a packaging region surrounding the display region, and an edge of the first electrode layer is disposed between the display region and the packaging region.

3. The display device according to claim 2, further comprising a display element formed in the display region, wherein the display element comprises the first electrode layer, and further comprises a second electrode, an organic light emitting layer, a pixel defining layer and a second conductive layer, wherein
   the pixel defining layer comprises a plurality of openings,
   the organic light emitting layer is disposed in the plurality of openings of the pixel defining layer,
   a second electrode layer is disposed between the substrate and the organic light emitting layer,
   the first electrode layer is formed on the organic light emitting layer and the pixel defining layer, and
   the second conductive layer is formed between the pixel defining layer and the first electrode layer, and the second conductive layer and the first conductive layer are in the same layer and are homogeneous.

4. The display device according to claim 1, wherein the first conductive layer comprises an inner edge portion extending towards the display region and an outer edge portion extending away from the display region, and the first electrode layer covers the inner edge portion of the first conductive layer.

5. The display device according to claim 4, wherein edges of first conductive layer and the first electrode layer are disposed in the region of the driving circuit.

6. The display device according to claim 5, wherein a distance by which an edge of the first electrode layer extends into the region of the driving circuit is 30% to 40% of a width of the driving circuit.

7. The display device according to claim 4, wherein the inner edge portion of the first conductive layer and an edge of the first electrode layer are disposed between the driving circuit and the display region.

8. The display device according to claim 1, wherein the first conductive layer is formed of ITO or metal.

9. The display device according to claim 3, wherein the pixel defining layer and the passivation layer are in the same layer and are homogeneous.

10. The display device according to claim 3, wherein the second conductive layer comprises a plurality of openings exposing the organic light emitting layer in the pixel defining layer.

11. The display device according to claim 1, wherein the first conductive layer comprises an inner edge portion extending towards the display region and an outer edge portion extending away from the display region, and the inner edge portion of the first conductive layer covers an edge of the first electrode layer.

12. The display device according to claim 2, wherein the first conductive layer comprises an inner edge portion extending towards the display region and an outer edge portion extending away from the display region, and the inner edge portion of the first conductive layer covers the edge of the first electrode layer.

13. The display device according to claim 1, wherein a thickness of the first electrode layer is 500Å.

14. The display device according to claim 1, wherein the driving circuit is one of a gate electrode driving circuit, a light emitting control driving circuit and a data driving circuit.

15. A display apparatus comprising the display device according to claim 1.

* * * * *